United States Patent
He et al.

(10) Patent No.: US 11,119,159 B2
(45) Date of Patent: Sep. 14, 2021

(54) ON-LINE DIAGNOSTIC METHOD FOR ELECTRONIC SWITCH FAULTS IN NEUTRAL-POINT-CLAMPED CONVERTERS

(71) Applicant: Marquette University, Milwaukee, WI (US)

(72) Inventors: Jiangbiao He, Schenectady, NY (US); Nabeel A. O. Demerdash, New Berlin, WI (US)

(73) Assignee: Marquette University, Milwaukee, WI (US)

( * ) Notice: Subject to any disclaimer, the term of this patent is extended or adjusted under 35 U.S.C. 154(b) by 293 days.

(21) Appl. No.: 15/775,247

(22) PCT Filed: Nov. 10, 2016

(86) PCT No.: PCT/US2016/061345
§ 371 (c)(1),
(2) Date: May 10, 2018

(87) PCT Pub. No.: WO2017/083527
PCT Pub. Date: May 18, 2017

(65) Prior Publication Data
US 2020/0292629 A1    Sep. 17, 2020

Related U.S. Application Data

(60) Provisional application No. 62/255,083, filed on Nov. 13, 2015.

(51) Int. Cl.
*G01R 31/54* (2020.01)
*G01R 31/40* (2020.01)
(Continued)

(52) U.S. Cl.
CPC ............ *G01R 31/54* (2020.01); *G01R 31/40* (2013.01); *H02M 7/487* (2013.01); *H02M 7/537* (2013.01); *H02P 27/08* (2013.01)

(58) Field of Classification Search
CPC ........ G01R 31/54; G01R 31/40; G01R 31/42; H02M 7/487; H02M 7/537; H02M 7/00;
(Continued)

(56) References Cited

U.S. PATENT DOCUMENTS 6,459,606 B1    10/2002   Jadric
6,972,972 B2    12/2005   Duncan et al.
(Continued)

FOREIGN PATENT DOCUMENTS

AU         665152 B2    12/1995
CN      104578865 A     4/2015
(Continued)

OTHER PUBLICATIONS

X. Li, S. Dusmez, B. Akin and K. Rajashekara, "A new SVPWM for phase currents reconstruction of three-phase three-level T-type converters," 2015 IEEE Applied Power Electronics Conference and Exposition (APEC), Charlotte, NC, 2015, pp. 1582-1588 (Year: 2015).*

(Continued)

*Primary Examiner* — Daniel R Miller
(74) *Attorney, Agent, or Firm* — Andrus Intellectual Property Law, LLP

(57) ABSTRACT

Systems and methods of diagnosing open-circuit fault in power converters receives a neutral point current value, a switching state of the power converter, and load current values. At least one fault condition is identified based upon the switching state of the power converter and the load current values. The neutral point current value current value is compared to the at least one fault condition. An open circuit fault is determined to be present at the switching state of the power converter based upon the comparison.

24 Claims, 9 Drawing Sheets

(51) Int. Cl.
*H02M 7/487* (2007.01)
*H02M 7/537* (2006.01)
*H02P 27/08* (2006.01)

(58) Field of Classification Search
CPC .. H02M 1/32; H02M 7/483; H02M 2001/325;
H02P 27/08; H02P 29/032; H02P 29/02;
H02P 27/06; H02H 7/1227
See application file for complete search history.

(56) References Cited

U.S. PATENT DOCUMENTS

| | | |
|---|---|---|
| 8,737,103 B2 | 5/2014 | Kieferndorf et al. |
| 8,847,328 B1 | 9/2014 | Laschek-Enders |
| 2012/0013369 A1 | 1/2012 | Coteus et al. |
| 2013/0148391 A1 | 6/2013 | Grbovic et al. |
| 2014/0369088 A1 | 12/2014 | Y00 |
| 2014/0376287 A1 | 12/2014 | Narimani et al. |
| 2015/0023080 A1 | 1/2015 | Chambon |

FOREIGN PATENT DOCUMENTS

| | | |
|---|---|---|
| JP | S61214775 A | 9/1986 |
| WO | 2015090735 A1 | 6/2015 |

OTHER PUBLICATIONS

U. Choi, F. Blaabjerg and K. Lee, "Reliability Improvement of a T-Type Three-Level Inverter With Fault-Tolerant Control Strategy," in IEEE Transactions on Power Electronics, vol. 30, No. 5, pp. 2660-2673, May 2015 (Year: 2015).*

A. Anthon, Z. Zhang, M. A. E. Andersen and T. Franke, "Efficiency investigations of a 3kW T-Type inverter for switching frequencies up to 100 kHz," 2014 International Power Electronics Conference (IPEC-Hiroshima 2014—ECCE Asia), Hiroshima, 2014, pp. 78-83 (Year: 2014).*

International Search Report and Written Opinion in corresponding International Application No. PCT/US2016/061345, dated Feb. 27, 2017.

* cited by examiner

ON-LINE DIAGNOSTIC METHOD FOR ELECTRONIC SWITCH FAULTS IN NEUTRAL-POINT-CLAMPED CONVERTERS

CROSS REFERENCE TO RELATED PATENT APPLICATIONS

The present application claims the benefit of priority under 35 U.S.C. § 119(e) to U.S. Provisional Patent Application No. 62/255,083, filed on Nov. 13, 2015, the contents of which is incorporated herein by reference in its entirety.

STATEMENT REGARDING FEDERALLY SPONSORED RESEARCH OR DEVELOPMENT

This invention was made with government support under NSF-GOALI Grant No. 1028348 awarded by the U.S. National Science Foundation (NSF). The Government has certain rights in this invention.

BACKGROUND

The field of the invention relates to diagnostic methods for identifying electronic switch faults in power converters. In particular, the field of the invention relates to diagnostic methods for identifying electronic switch faults in neutral-point-clamped (NPC) power converters.

With the advantages of having low harmonic distortions, withstanding high DC-bus voltage, and generating low common-mode voltages, NPC multilevel power converters have been increasingly applied in various industrial applications, including adjustable speed drives (ASDs), uninterruptible power supplies (UPSs), static compensators (STATCOMs), and the like.

One concern raised by the utilization of such NPC multilevel converters is the potentially degraded reliability due to the use of large number of switching devices and the associated gate driver circuits. Thus, there is a greater necessity to detect and diagnose common electrical switch faults, such as device short-circuit and open-circuit faults in multilevel converters. Solutions to detect short-circuit faults in the switching devices in power electronic systems have received much attention over the past decades. However, open-circuit fault detection in switching devices has not received adequate attention. As a matter of fact, open-circuit faults in power converters can be encountered more often in some applications where the converters are operating for prolonged periods at low output frequencies and heavy loads, such as in elevators, servo drives, electric vehicles (EVs) or hybrid electric vehicles (HEVs), and the like. In such low-frequency and heavy-load operating modes, generally there will be high fluctuations of junction temperatures in switching devices. Such phenomena will cause open-circuit faults due to "bond wire lift-off" or "solder joint cracking" in such switching devices.

There are a few diagnostic methods that have been proposed, these will be reviewed as follows, and each of which are incorporated by reference herein in their entireties.

An open-switch fault diagnostic method based on detecting the dimensions and orientation angle of the so-called "Concordia current patterns" is disclosed by U. M. Choi, H. G. Jeong, K. B. Lee and F. Blaabjerg, "Method for detecting an open-switch fault in a grid-connected NPC inverter system," *IEEE Trans. on Power Electronics*, vol. 27, no. 6, pp. 2726-2739, 2012. The Concordia current pattern of a healthy circuit operation should be ideally a circle which is distorted in the event of an open-circuit switch fault. This method assumes that these distortions are unique for each IGBT switch and therefore can be detected by pattern recognition techniques. A drawback with this method is that, such "Concordia current patterns" change with the load or DC-bus voltage unbalance condition, which may cause misdiagnosis of such open-circuit switch faults.

Open-circuit switch fault detection using an "average current Park's vector approach" is disclosed by M. B. Abadi, A. M. S. Mendes, and S. M. A. Cruz, "Three-level NPC inverter fault diagnosis by the average current park's vector approach," in 2012 *International Conference on Electrical Machines (ICEM)*, Marseille, 2012, pp. 1893-1898. This method relies on the analysis of the Park's vectors of the mean value of each inverter output AC current over one fundamental period. In the event of an open-circuit fault, a magnitude of the Park's vector will increase, enabling detection of a faulty switch. However, this approach assumes that the three-phase AC power source has a floating neutral point and therefore will not work for NPC converters fed by three-phase sources with a solidly grounded or high resistance grounded (HRG) neutral point.

J. S. Lee, K. B. Lee and F. Blaabjerg, "Open-switch fault detection method of a back-to-back converter using NPC topology for wind turbine systems," *IEEE Trans. on Industry Applications*, vol. 51, no. 1, pp. 325-335, 2015, disclosed an open-switch fault detection method for back-to-back NPC converters. However, this diagnostic method can only distinguish the faults between the upper and lower branches in a phase leg rather than identifying a specific faulty switch. Therefore, this approach cannot be used to operate fault resistance switching controls which require identification of the faulty switch. Additionally, AC current information on the input of the NPC rectifier, as used by the method, typically contains rich harmonics/ripples due to the high-frequency switching of the rectifier which may mask the fault signatures for detection.

An on-line diagnostic method for IGBT open-circuit faults in a three-phase three-level active NPC (ANPC) inverter is disclosed in J. He and N. A. O. Demerdash, "Diagnosis of open-circuit switch faults in multilevel active-NPC (ANPC) inverters," in 2014 *IEEE Transportation Electrification Conference*, Dearborn, Mich., 2014, pp. 1-6. That method uses the instantaneous three-phase pole voltages, the polarities of the three-phase currents and the inverter switching strategy in a look-up table to find an expected value(s) to which the measured pole voltages are compared.

P. Fazio, M. Marchesoni and G. Parodi, "Fault detection and reconfiguration strategy for ANPC converters," in 15th *International Power Electronics and Motion Control Conference*, Novi Sad, Serbia, pp. DS1b.17-1-DS1b.17-5, disclose monitoring the clamp branch currents for detecting IGBT faults in a three-phase three-level ANPC inverter. This disclosed system uses a Rogowski coil on each upper and lower clamp branch which greatly increases the complexity and cost of the inverter.

Therefore, while attempts have been made to provide fault detection in NPC-inverter-based power electronic systems, the currently available solutions exhibit some or all of a high cost for implementation, slow fault detection speed, and ambiguity/limited robustness in the diagnostic outcome. Therefore, there remains a desire for improved diagnostic systems and methods for the NPC-inverter-based power electronic systems.

SUMMARY

An exemplary embodiment of a method of diagnosing an open-circuit fault in a power converter includes receiving a neutral point current value. A switching state of the power converter is received. Load current values are received. At least one fault condition is identified based upon the switching state of the power converter and the load current values. The neutral point current value is compared to the at least one fault condition. An open-circuit fault is determined to be present at the switching state based upon the comparison of the neutral point current value to the at least one fault condition. A response is initiated based upon a determination of the open-circuit fault.

In an further exemplary embodiment, determining the at least one fault condition further includes calculating an expected neutral point current value based upon the switching state of the power converter and the load current values. A received neutral point current value is compared to the expected neutral point current value. A probable fault condition is determined based upon the comparison of the received neutral point current value to the expected neutral point current value. In an still further exemplary embodiment, determining the at least one fault condition further includes identifying at least one fault condition based upon the switching state of the power converter. The received neutral point current value is compared to the at least one fault condition. The open circuit fault is determined to be present based upon the comparison.

An exemplary embodiment of a system for diagnosing open-circuit faults in a multi-level power converter includes a neutral point current transducer. The neutral point current transducer is configured to measure a neutral point current value from a DC-bus midpoint of the power converter. Load current transducers are configured to measure load current values from a plurality of phase legs of the multi-level power converter. A microcontroller receives a switching state of the multi-level power converter, receives the neutral point current value from the neutral point current transducer, and receives the load current values from the load current transducers. The microcontroller identifies at least one fault condition based upon the switching state of the multi-level power converter and the load current values. The microcontroller compares the neutral point current value to the at least one fault condition. The microcontroller determines an open-circuit fault is present at the switching state based upon the comparison and initiates a respose based upon the determination of the open-circuit fault.

An exemplary embodiment of a power converter that self-monitors for open-circuit faults includes a DC-bus having a positive terminal, a negative terminal, and a DC-bus midpoint. A neutral point clamped (NPC) inverter is electronically connected to the DC-bus at the positive terminal, the negative terminal, and the DC-bus midpoint. The NPC inverter includes a plurality of phase legs. Each phase leg includes a plurality of switches configured to operate to control eh power delivered at each phase leg through a plurality of switching states. A neutral point current transducer is connected to the DC-bus midpoint to measure a neutral point current value. A load current transducer of a plurality of load current transducers is connected to each phase leg of the plurality of phase legs to measure load current values from each of the plurality of phase legs. A microcontroller is operatively connected to the NPC inverter to operate each of the switches of the NPC inverter through a plurality of switching states. The microcontroller receives the neutral point current value from the neutral point current transducer and receives the load current values from the load current transducers. The microcontroller further identifies at least one fault condition based upon a current switching state of the NPC inverter and the load current values. The microcontroller compares the neutral point current value to the at least one fault condition and determines and open-circuit fault is present at the switching state based upon the comparison. The microcontroller initiates a response based upon the determination of the open-circuit fault.

DETAILED DISCLOSURE

Figure 1:
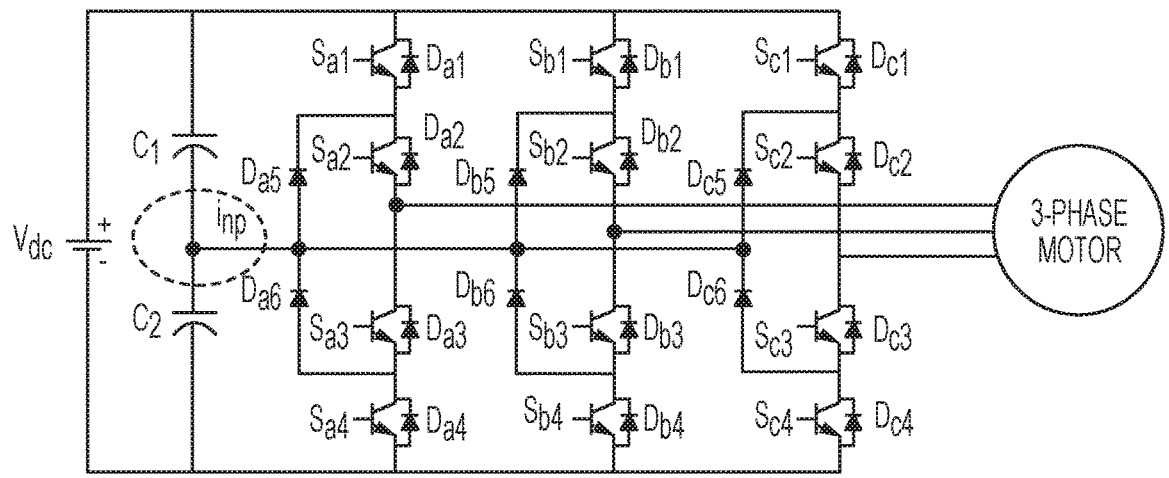
FIG. 1 is a schematic diagram of a circuit topology of a Three-level I-Type NPC converter.

The disclosed subject matter further may be described utilizing terms as defined below.

Unless otherwise specified or indicated by context, the terms "a", "an", and "the" mean "one or more."

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

Safety and reliability have been two critical factors in evaluating industrial adjustable speed drives (ASDs). ASDs often rely upon neutral point clamped (NPC) power converters to supply the requisite three phase power. NPC power converters can exemplarily either be DC-to-AC inverters or AC-to-DC rectifiers. In exemplary embodiments the NPC power converters may be single-phase or multi-phase, including but not limited to bi-phase and three-phase power converters. With the increase of power capacities and the price decrease of semiconductor devices, multilevel converters are being increasingly applied in adjustable speed drives, especially for high-power (above 0.75 MVA) or medium-voltage (2.3-13.8 kV) applications. One concern raised by the utilization of multilevel converters is the potentially degraded reliability due to the large number of switching devices and the associated gate driver circuits used. Thus, there is a need to more frequently detect and diagnose common electrical faults, such as device short-circuit faults and open-circuit faults, in multilevel converter-based ASDs. Solutions to detect short-circuit faults in the switching devices in power electronic systems have received much attention in the past decades, including the "desaturation detection" method, which has been integrated into almost every available high-performance gate driver. However, improved open-circuit fault detection is needed in switching devices. In exemplary settings and uses, open-circuit faults in power converters can be encountered more often than short circuit faults, for example where the ASDs are operating for prolonged periods at low output motor speeds and high torque, such as in elevators, electric vehicles (EVs) or hybrid electric vehicles (HEVs), and the like. In such low-speed and high torque operating modes, generally there will be high fluctuations of junction temperatures in switching devices such as Insulated Gate Bipolar Transistors (IGBTs) or Field Effect Transistors (FETs), which are due to the mismatch of Coefficient of Thermal Expansion (CTE) among different component materials and the resulting large thermal-mechanical stress on the bond wire and soldering inside these devices. Such phenomena will cause open-circuit faults due to bond wire lift-off or solder cracking in the switching devices.

Detection of open-circuit faults are further important in the context of NPC power converters as generally, a short-circuit failure mode in IGBT modules concludes with an open-circuit mode due to the large short-circuit current and rapid accumulated heat dissipation in IGBT bond wires or soldering joint if, particularly if no fast protection actions are available (typically protection speed should be within 10 µs). Short circuit faults are detected for example using "desaturation detection" as mentioned above and may result in the deployment of such fast protection actions. If a short-circuit failure lasts longer than or persists after such fast protection actions as may be available, the large short-circuit current will change the short-circuit fault into open-circuit fault by melting the bond wires or cracking the soldering joint in the IGBT package. Thus, detection of open-circuit faults is important regarding the ongoing operation of an NPC converter, particularly until the NPC converter can be repaired or replaced.

In exemplary embodiments, both topologies of the NPC converter may be used to provide three-phase power to a motor. A comparison of the I-type topology to the T-type topology shows that the I-type topology uses four transistors (Sx1-Sx4) and six diodes (Dx1-Dx6) (wherein x=a, b, or c) for each phase leg (A, B, C). The I-type topology uses a single connection from the DC-bus midpoint to each set of bi-directional midpoint switches (Sx3, Sx4) through diodes Dx5 and Dx6. The positive switches (Sx1 and Dx1) are connected to the phase leg output through a series connection to midpoint switches Sx2. The negative switches (Sx4 and Dx4) are connected to the phase leg output through a series connection to midpoint switches Sx3. Through this topology, the circuit of the I-type converter uses more electrical components (e.g. diodes Dx5 and Dx6), and any power flows through more components during operation, therefore the I-type converter provides a more robust topology, being able to handle higher voltages. The T-type topology converter is a more efficient topology (eliminating diodes Dx5 and Dx6) and connecting each of the positive switch (Sx1), negative switch (Sx2) and the bi-direction midpoint switches (Sx3, Sx4) to the respective phase leg outputs. However, the efficiency of the design makes T-type topology less robust, and therefore the T-type topology is only usable under lower voltage conditions. Phase leg current transducers in each of the phase legs can be used to measure the respective load currents ($i_a$, $i_b$, $i_c$) in each of the Phase legs. Additionally a DC-bus current transducer is used to measure the neutral point current ($i_{np}$). As will be described herein embodiments of the system and method can detect and diagnose open circuit faults within the power conversion system using these measurements.

Figure 2:
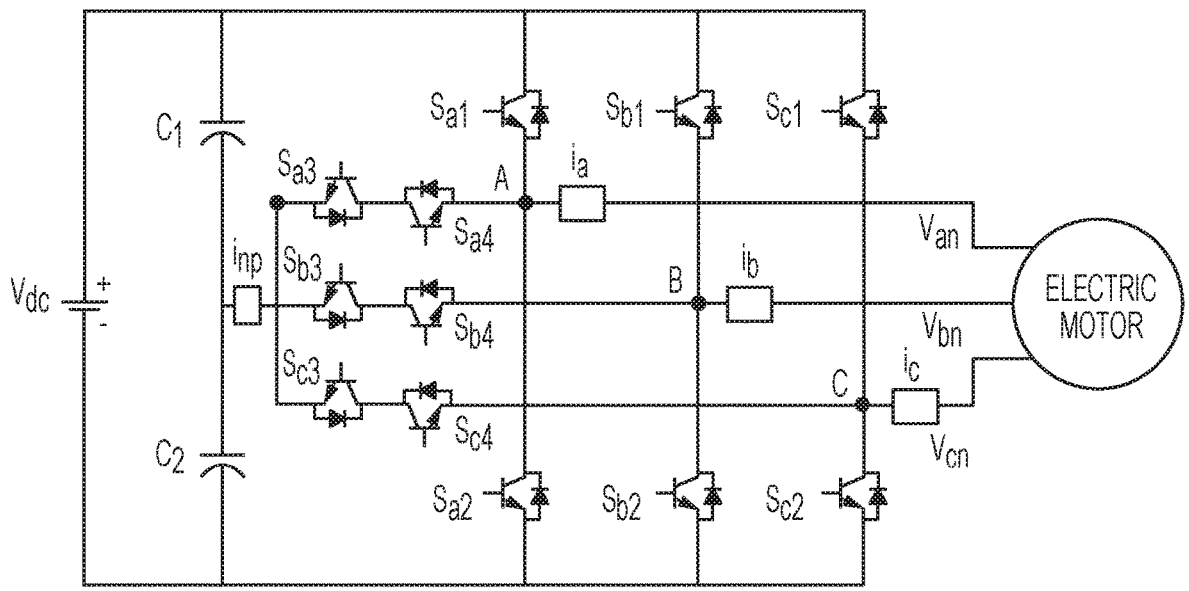
FIG. 2 is a schematic diagram of a circuit topology of a Three-level T-Type NPC converter.
Figure 3:
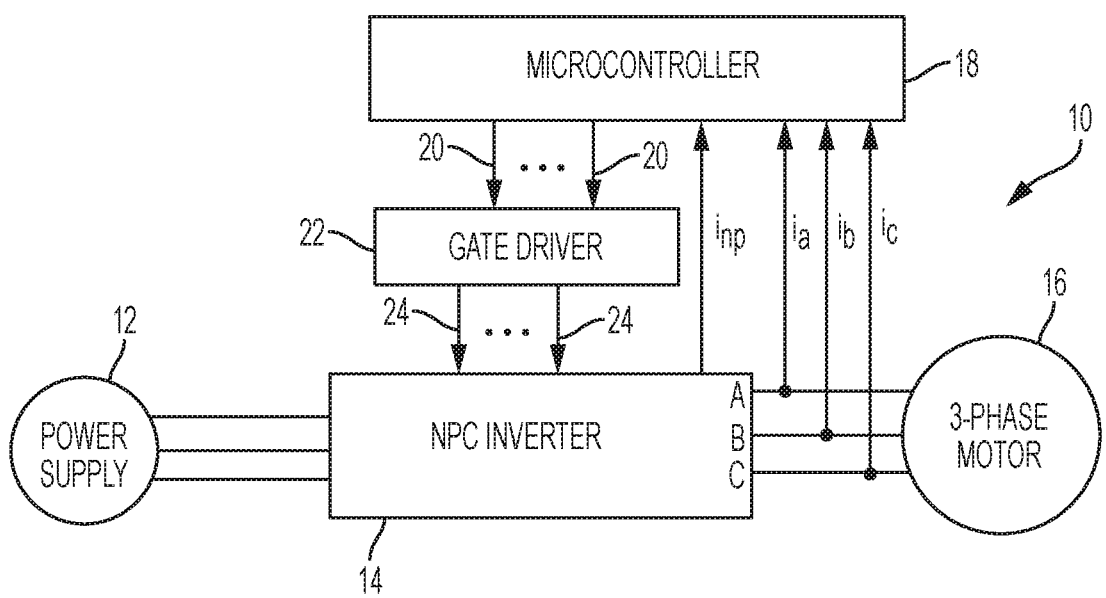
FIG. 3 is a schematic diagram of an exemplary embodiment of a power converter.

FIG. 3 is a schematic diagram of an exemplary embodiment of a power conversion system 10, the power conversion system 10 exemplarily includes power supply 12 connected to a neutral point clamped (NPC) power converter 14. The NPC power converter 14 is exemplarily embodied in either of the I-type topology or the T-type topology as described above with respect to FIGS. 1 and 2. The NPC power converter 14 provides three-phase power to a three-phase motor 16 through three phase legs A, B, and C. The NPC power converter 14 is communicatively and operably connected to a microcontroller 18. The microcontroller 18 provides control signals 20, exemplarily pulse width modulated (PWM) control signals to a gate driver circuit 22. The gate driver circuit 22 in turn provides gate signals 24 to the switches of the NPC power converter 14. In response to the gate signals 24, the switches of the NPC power converter 14 operated between open and closed conditions. The controller 18 provides the control signals 20 exemplarily based upon a predetermined state control, which is implemented for the operation of the power conversion system 10.

Figure 4:
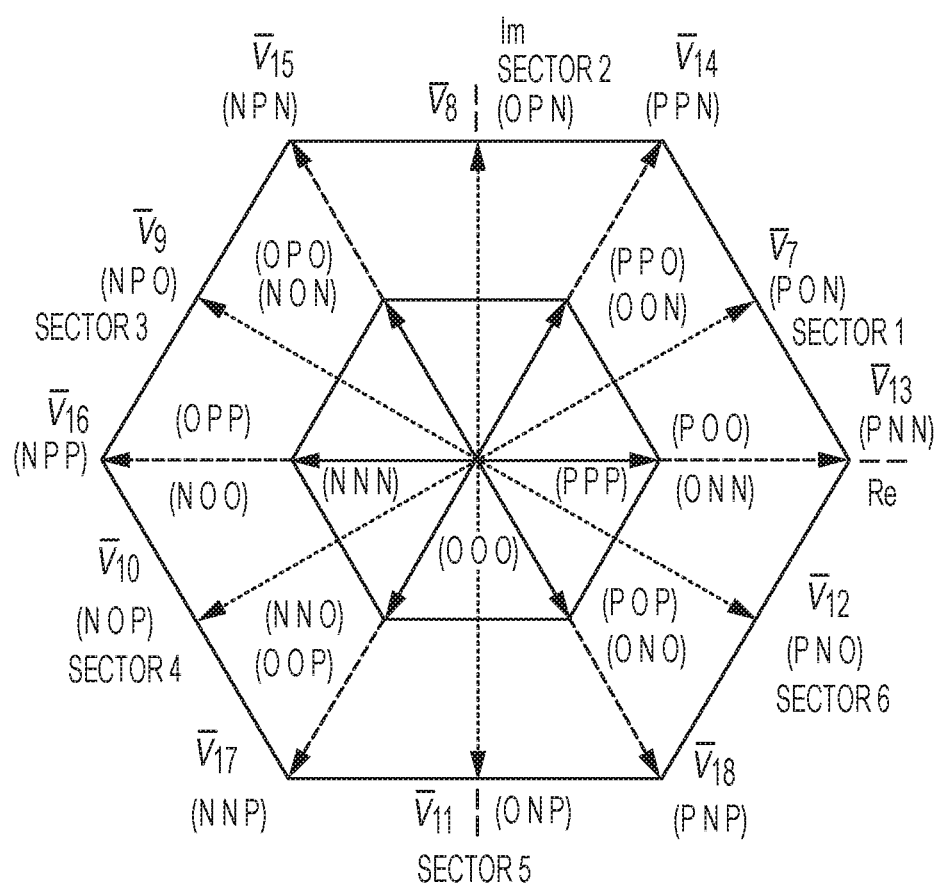
FIG. 4 diagrammatically depicts the switching state vectors of a three-level NPC inverter.

FIG. 4 is a voltage space vector diagram that exemplarily depicts the switching state vectors for of a three-level NPC inverter. The microcontroller 18 cycles through the switching states to sequentially provide three phase power through the power conversion system 10. In the present disclosure, the output voltage of each phase leg of the T-type inverter is designated as "P", "O", and "N," to represent positive DC-bus voltage (+$V_{dc}$/2), zero, and negative DC-bus voltage (−$V_{dc}$/2). For instance, the switching state, (P, O, N), implies that the output pole voltages of Phase-A, Phase-B, and Phase-C are (+$V_{dc}$/2), O, and −$V_{dc}$/2), respectively. It is well known that there are 27 switching states for a three-level T-Type inverter, as illustrated in the voltage space vector diagram given in FIG. 4.

For fault detection, the microcontroller 18 receives a plurality of fault detection inputs that are used as disclosed in further detail herein to determine open-circuit faults in the switches of the NPC power converter 14. The microcontroller 18 receives the measured currents $i_x$ from each of the three phase legs of the NPC inverter 14. The microcontroller 18, further receives the neutral point current $i_{np}$ measured by the current transducer located at the DC-bus midpoint.

The fault tolerant converter 14 is connected to a microcontroller 18, which receives fault detection inputs from the T-Type NPC converter 14 and fault detection inputs from the redundant phase leg. As will be described in further detail herein, the fault detection inputs may include measured voltages and/or currents within the fault tolerant converter 14 which are used by the microcontroller 18 to operate the switches as described in further detail herein.

The microcontroller 18 provides control signals 20, exemplarily pulse width modulated (PWM) control signals to a gate driver circuit 22. The gate driver circuit 22 in turn provides gate signals 24 to the switches of the T-Type NPC converter 14 and gate signals 24 to the switches of the redundant phase leg. Each switch may be embodied as an insulated-gate bipolar transistor (IGBT), a metal-oxide-semiconductor field effect transistor (MOSFET), a junction field effect transistor (JFETs), thyristors, or any other types of solid-state switching devices as may be recognized by a person of ordinary skill in the art. The switches operate based upon the gate signals between open and closed conditions as described in further detail herein.

Embodiments of the on-line diagnostic system and method are usable to detect open circuit faults in both I-type and T-type converter topologies. Embodiments, as disclosed herein do so with an economical implementation that only uses current transducers and an algorithmic solution that is simple enough that it can be stored as computer executable code in software or firmware stored at the microcontroller or in computer readable storage connected to the microcontroller such that a microcontroller embedded in the system is capable of performing the fault condition detection. While embodiments as disclosed herein may be implemented in a microcontroller embedded with the power converter, and in an example, is the same microcontroller as controls the switches, in other embodiments, multiple microcontrollers may be used, including one which may be remotely located from the power converter and communicatively connected to receive the measured currents and switch states and determine any open circuit faults conditions.

Figure 5:
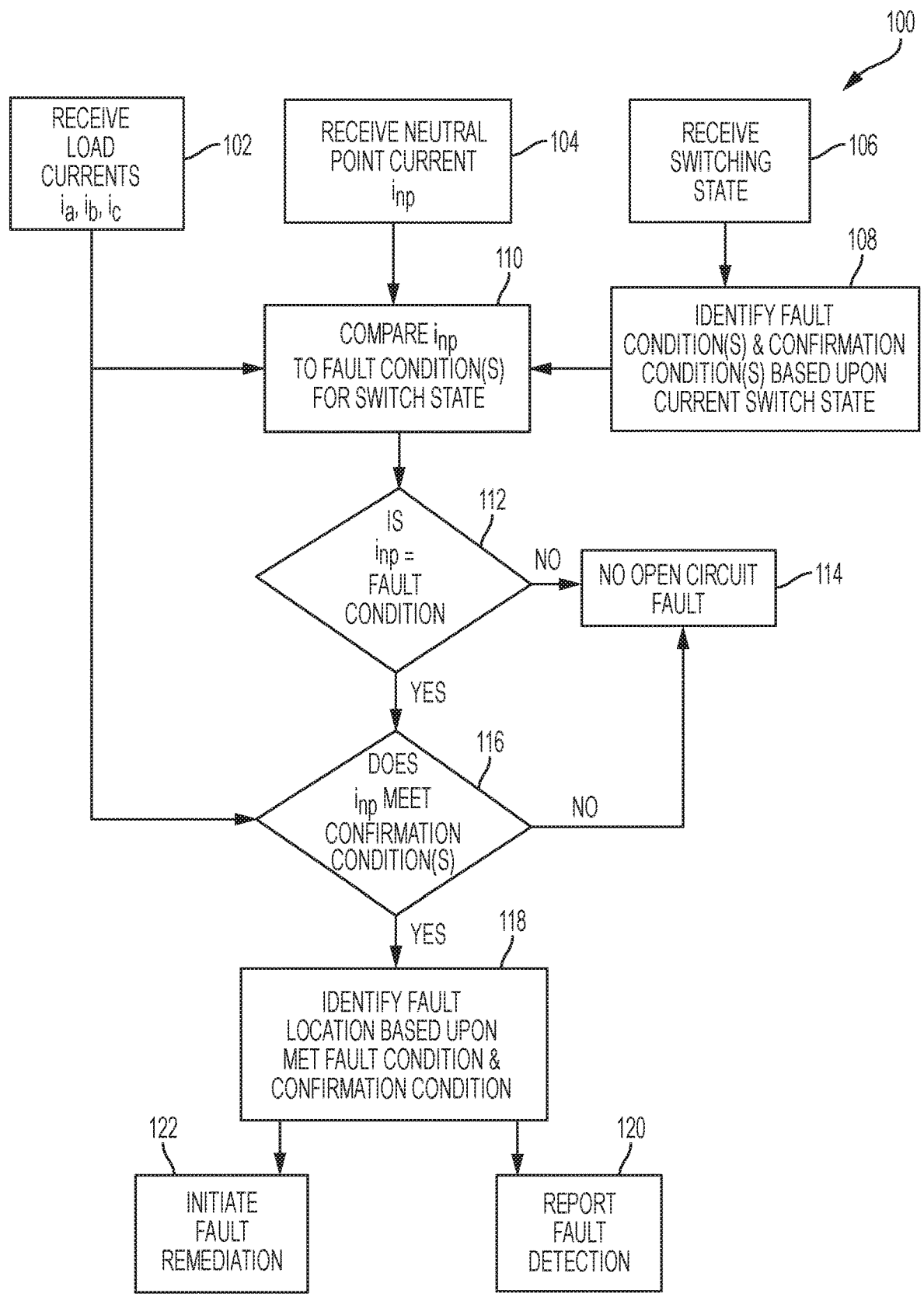
FIG. 5 is a flow chart that depicts an exemplary embodiment of a method of detecting faults in a power converter.

FIG. 5 is a flow chart that depicts an exemplary embodiment of a method 100 of detecting open-circuit faults in an NPC converter. In the method 100, the microcontroller receives load currents ($i_a$, $i_b$, $i_c$) at 102. For example, the load currents may be measured by a current transducer located on each phase leg. The microcontroller receives the neutral point current ($i_{np}$) at 104. The neutral point current may be measured by a current transducer located at the DC-bus midpoint. In exemplary embodiments, these current measurements may be provided directly to the microcontroller, while in other embodiments, the current measurements may be stored and received by the microcontroller at another time. Additionally, at 106 the microcontroller receives a current switching state of the NPC power converter. As described above, FIG. 4 depicts the switch states as may be experienced in an inverter of a power converter. In an exemplary embodiment, the microcontroller operates the power converter to the various switch states. In such an embodiment, the microcontroller will receive the switching state internally. In another embodiment wherein the fault detection is performed by a separate microcontroller, the separate microcontroller may receive the current switch state from the first microcontroller.

At 108, the microcontroller identifies fault condition(s) and confirmation condition(s) based upon the current switch state. In an exemplary embodiment, a lookup table with the various switching states and the associated fault conditions and confirmation conditions may be referenced by the microcontroller to identify at least one fault condition and at least one confirmation condition with which to test the neutral point current. Table 1 provides an exemplary embodiment of the lookup table as described in further detail herein.

TABLE I

Diagnostic Look-Up Table for Open-Circuit Switch Faults in the Three-Level T-Type Inverter.

| Switch | Switching States | Fault Condition | Confirmation Condition | Result |
|---|---|---|---|---|
| $S_{a1}$ | (P, O, O) | If $i_{np} = 0$ | $i_a > 0$ | $S_{a1}$ is "Open" |
|  | (P, N, N) | If $i_{np} = i_a$ | $i_a > 0$ | $S_{a1}$ is "Open" |
| $S_{a2}$ | (O, P, N), (O, N, P) (O, N, N), (O, P, P) | If $i_{np} = 0$ | $i_a > 0$ | $S_{a2}$ is "Open" |
| $S_{a3}$ | (O, P, N), (O, N, P) (O, N, N), (O, P, P) | If $i_{np} = 0$ | $i_a < 0$ | $S_{a3}$ is "Open" |

TABLE I-continued

Diagnostic Look-Up Table for Open-Circuit Switch Faults in the Three-Level T-Type Inverter.

| Switch | Switching States | Fault Condition | Confirmation Condition | Result |
|---|---|---|---|---|
| $S_{a4}$ | (N, O, O) | If $i_{np} = 0$ | $i_a < 0$ | $S_{a4}$ is "Open" |
|  | (N, P, P) | If $i_{np} = i_a$ | $i_a < 0$ | $S_{a4}$ is "Open" |
| $S_{b1}$ | (O, P, O) | If $i_{np} = 0$ | $i_b > 0$ | $S_{b1}$ is "Open" |
|  | (N, P, N) | If $i_{np} = i_b$ | $i_b > 0$ | $S_{b1}$ is "Open" |
| $S_{b2}$ | (P, O, N), (N, O, P) (N, O, N), (P, O, P) | If $i_{np} = 0$ | $i_b > 0$ | $S_{b2}$ is "Open" |
| $S_{b3}$ | (P, O, N), (N, O, P) (N, O, N), (P, O, P) | If $i_{np} = 0$ | $i_b < 0$ | $S_{b3}$ is "Open" |
| $S_{b4}$ | (O, N, O) | If $i_{np} = 0$ | $i_b < 0$ | $S_{b4}$ is "Open" |
|  | (P, N, P) | If $i_{np} = i_b$ | $i_b < 0$ | $S_{b4}$ is "Open" |
| $S_{c1}$ | (O, O, P) | If $i_{np} = 0$ | $i_c > 0$ | $S_{c1}$ is "Open" |
|  | (N, N, P) | If $i_{np} = i_c$ | $i_c > 0$ | $S_{c1}$ is "Open" |
| $S_{c2}$ | (P, N, O), (N, P, O) (N, N, O), (P, P, O) | If $i_{np} = 0$ | $i_c > 0$ | $S_{c2}$ is "Open" |
| $S_{c3}$ | (P, N, O), (N, P, O) (N, N, O), (P, P, O) | If $i_{np} = 0$ | $i_c < 0$ | $S_{c3}$ is "Open" |
| $S_{c4}$ | (O, O, N) | If $i_{np} = 0$ | $i_c < 0$ | $S_{c4}$ is "Open" |
|  | (P, P, N) | If $i_{np} = i_c$ | $i_c < 0$ | $S_{c4}$ is "Open" |

For example, if the switch state is P, O, O; then according to the look-up table, the fault condition is 0, or inp=0 if there is an open-circuit fault occurring in the switch Sa1 in Phase-A leg of the NPC inverter. In other words, if the NPC inverter is operated in the switch state of P, O, O, then an open fault can be detected within one or multiple switching/modulation cycles if the neutral point current equals zero. This is exemplarily shown in FIG. 6 which exemplarily depicts the A phase leg of a T-type NPC inverter, exemplarily operated in the switch state P, O, O. Arrow 40 exemplarily depicts the current flow direction during healthy operation of the circuit. Arrow 42 exemplarily depicts the current flow direction if there is an open circuit fault in switch Sa1. If Sa1 has an open circuit, the output terminal would not be connected to the positive DC-bus during the "P" state, at positive load current (Phase-A current flowing from the DC source to the load), as shown by Arrow 40. Instead, the output AC terminal of Phase-A leg will be connected to the DC-bus neutral point through the freewheeling diode $D_{a3}$ and the middle MOSFET $S_{a2}$, as shown by Arrow 42. As a result, the Phase-A current, $i_{a1}$, loses a large part of the positive current. Additionally, the upper DC-link capacitor will be more charged than the lower capacitor due to the open-circuit fault in the MOSFET $S_{a1}$, which will result in a much larger voltage in the upper capacitor $C_1$ than that in the lower capacitor $C_1$. Specifically, the voltages of the positive and negative DC-bus are given as:

$$v_{c1} = \frac{1}{c}\int i_1 dt + \frac{V_{dc}}{2} \qquad (1)$$

$$v_{c2} = -\frac{1}{c}\int i_2 dt + \frac{V_{dc}}{2} \qquad (2)$$

where, $v_{c1}$ and $v_{c2}$ refers to the upper capacitor voltage and lower capacitor voltage, respectively. The capacitance value of $C_1$ and $C_2$ are assumed to be: $C_1=C_2=C$. Here, $V_{dc}$ is the DC-bus voltage, and $i_1$ and $i_2$ represent the upper capacitor current and lower capacitor current. Once an open-circuit fault occurs in $S_{a1}$, the average value of $i_1$ will be larger than $i_2$, which results in a high upper DC-bus voltage $v_{c1}$.

The DC-bus neutral-point current, $i_{np}$, of the T-Type inverter can be expressed as a function of the phase currents and the switching states of the inverter in the following equation:

$$i_{np}=(1-|S_a|)i_a+(1-|S_b|)i_b+(1-|S_c|)i_c \tag{3}$$

where, $S_a$, $S_b$, and $S_c$ are the switching functions of the three-level inverter, taking the value of 1, 0, or −1 (P, O, or N), and $i_a$, $i_b$, and $i_c$ are the instantaneous three phase currents. Since an open-circuit MOSFET fault can affect the actual switching state, the neutral point current, $i_{np}$, will be changed by the related fault. In other words, such current information in combination with the switching states and phase currents can indicate all the MOSFETs' health condition during operation. More specifically, a faulty MOSFET device in a T-Type inverter can be identified by comparing the actual value of the neutral-point current under faulty condition to the expected value at otherwise healthy condition (or the expected value at a fault condition). In most instances, the open circuit fault drives the neutral point current to a value of 0. The lookup table presented above at Table 1, provides an example of a manner in which the expected value or expected fault value.

Returning back to the example, above, when the switch state is (P, O, O), the look up table above identifies that in the fault condition, the average value of $i_{np}$ is compared to zero. More specifically, if the average value of $i_{np}$ during the state (P, O, O) is zero, an open-circuit fault in $S_{a1}$ can be determined. This is because of the fact that the open-circuit fault in $S_{a1}$ will make the switching state (P, O, O) operate as state (O, O, O). According to Equation (3), such change of the switching state enables the neutral point current, $i_{np}$, to change from Equation (2) to Equation (3) which are given as follows:

$$i_{np}=i_b+i_c \tag{4}$$

$$i_{np}=i_a+i_b+i_c \tag{5}$$

Figure 6:
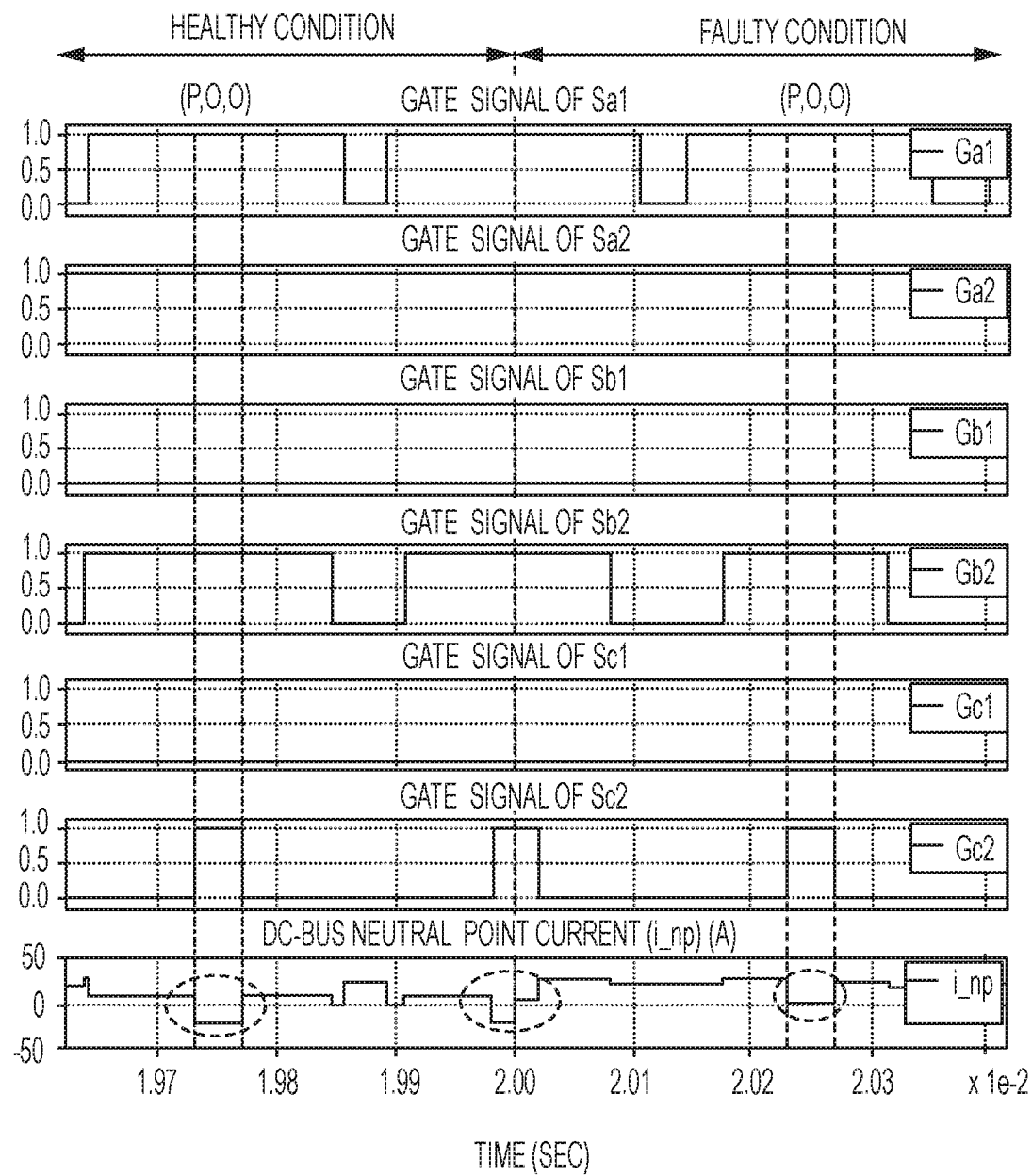

Thus, $i_{np}$ will be zero under the aforementioned faulty condition, assuming that the neutral point of the load is isolated. FIG. 6 is a graph that depicts the relative gate signals at various switching states, along with the DC-bus neutral point current resulting at these states both under a healthy circuit condition and at the faulty current condition of an open-circuit fault in $S_{a1}$. At switching state (P, O, O) of the T-Type inverter, the value of $i_{np}$ under healthy condition is ($i_b+i_c$), which is −20 A in this case. However, when an open-circuit fault in $S_{a1}$ is triggered at t=0.02 second, the value of $i_{np}$ becomes zero. All these variations of the value of $i_{np}$ are marked with dashed ellipses in FIG. 6. It will be recognized that while this phenomenon is characterized as the value of $i_{np}$ being zero, that in practice there is a proper hysteresis band around zero that should be considered in implementation due to the resulting common-mode voltages occurring during the switching.

Referring back to the method 100 and FIG. 5, once the fault condition(s) and the confirmation condition(s) are identified at 108, for example by way of reference to the table above, the fault conditions are compared to the value of the neutral point current $i_{np}$ at 110. At 112 the fault condition(s) for that switching state are applied and a determination is made whether the value of $i_{np}$ equals the fault condition. If the value of $i_{np}$ does not equal the fault condition, then there is not an open circuit fault that can be detected at that switching state as represented at 114. If it is determined at 112 that the value of $i_{np}$ equals the fault condition, then further analysis is required to identify the location of the faulty switch. It will be noted from the table above, that the most common fault condition is that of $i_{np}=0$, although for some switching states the fault condition is one of the load currents. Therefore, while meeting the fault condition for that switching state may indicate a fault, further analysis is needed to identify the location of the open circuit fault between switches having the same fault condition.

At 116 the confirmation conditions for the current switching state as obtained at 108 are applied to the value of $i_{np}$ to determine if any of the confirmation conditions are met. If none of the confirmation conditions are met, then no open circuit switch fault can be confirmed at that switching state at 114. If one of the confirmation conditions are met, then at 118 the location of the open circuit fault can be identified within one or multiple/modulation switching cycles, based upon the fault condition met and the confirmation condition met, as identified in the lookup table above.

With the location of the open circuit fault identified, the method can initiate a response to the detected fault and identified fault location. In an exemplary embodiment, this initiated response may be reporting the fault detection and/or location at 120. In an embodiment, the report of the fault detection and/or location can be made on a graphical display associated with the microcontroller and/or the power converter. In another embodiment, the microcontroller may transmit a communicative signal to another location either through a wired or a wireless communicative connection to report the fault detection and/or location at another computer, which may include producing an indication on a graphical display associated with the computer that received the communication. In still further embodiments, the fault detection and/or location can be reported by an automated message through communication platforms including human-machine interface, text messaging, or other displaying instrument. In another example, the fault detection and/or location can be reported by storing the event in a log or database of detected events which may be stored at a computer readable medium associated with the microcontroller and such stored report may be accessed and reviewed at another time.

In other embodiments, the microcontroller may initiate a fault remediation at 122. In some embodiments of power converters are constructed with circuit redundancy with parallel and/or backup switches available to be operated by the microcontroller in the event of a switch fault to maintain operation. Once the microcontroller identifies a fault in a particular switch, the microcontroller can respond to mitigate the fault by operating in remediation mode and/or switching strategy to maintain operation of the power converter.

Figure 7:
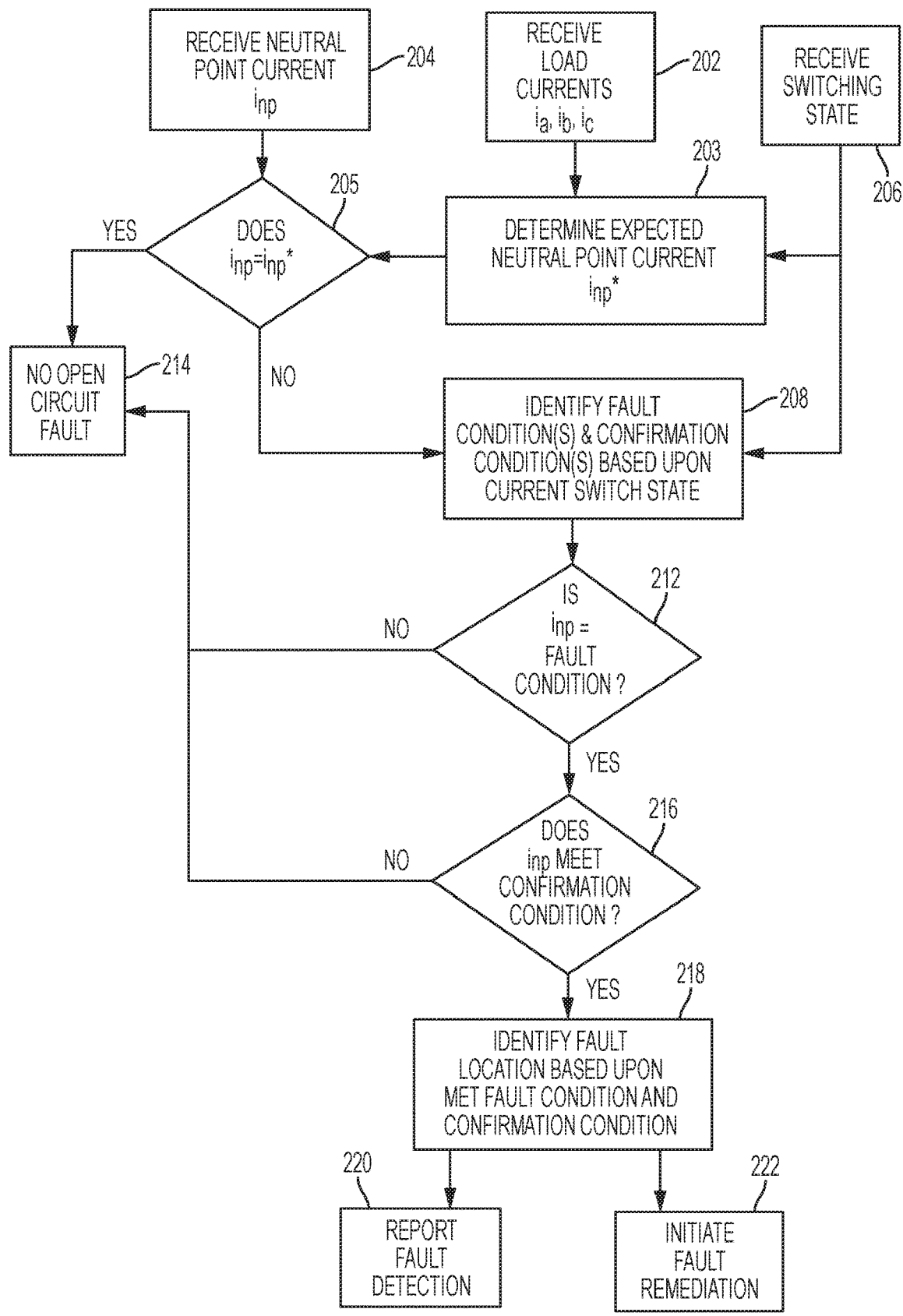

FIG. 7 is a flow chart that depicts an exemplary additional embodiment of a method 200 of detecting open-circuit faults in an NPC converter. The underlying concept behind method 100 and method 200 is the same, and much of the analysis is the same. Therefore, similar reference numerals are used between the two flow charts to reference similar actions as already described above. However method 200 differs from the method 100 in the manner in which the circuit operation is screened to detect fault occurrences. Since there are 27 switching states through which the power converter cycles, the method can look for faults based upon the fault conditions for each switching state as set forth in method 100. Alternatively, the method 200 conducts a screening of the neutral point current to focus the later analysis only in the event of a possible or suspected fault.

At 203, the method 200 uses the switching state received at 206 and the load currents received at 204 to determine an expected neutral point current value, $i_{np}$*. The expected neutral point current $i_{np}$* is exemplarily calculated using Eq. 1 discussed above. Because in a healthy circuit, the neutral point current $i_{np}$ should be a function of the load currents and the switching state, this can be used to provide an initial screening if there is a potential fault.

At 205, the actual neutral point current value $i_{np}$, having been received at 204, is compared to the expected neutral point current value $i_{np}$* calculated at 203. If the actual neutral point current value $i_{np}$ is equal to the expected neutral point current value $i_{np}$*, then the circuit is considered to be healthy and there is no open circuit switch fault 214 at detectable at that switching state. If the actual neutral point current value $i_{np}$ is not equal to the expected neutral point current value $i_{np}$*, then there is a potential or suspected open circuit fault to be confirmed and located. This is done in the same manner as described above with respect to the method 100. One possible advantage of the method 200 is that the fault conditions and confirmation conditions are only identified and applied in the event that actual neutral point current value $i_{np}$ is not equal to the expected neutral point current value $i_{np}$* at 205. Exemplary embodiments of the system and methods as described herein may provide advantages over previous attempts to detect open circuit faults in NPC power converters. Embodiments as disclosed herein may be able to be implemented with the hardware addition of a current sensor to acquire the DC-bus neutral-point current. The information on the switching states and load currents is generally available to the microcontroller of currently available power electronic systems.

Embodiments of the system and method can be implemented by a microcontroller with the use of comparatively simple mathematical and/or logical computations. While some previous solutions relied upon complex algorithms for example, artificial intelligence or neural net for detection, those solutions are computationally heavy and therefore would be prohibitively difficult to implement on a microcontroller of a power converter.

Exemplary embodiments of the system and method exhibit a robustness to detect and identify open-circuit faults in the presence of other internal or external disturbances, for example a DC-bus capacitor voltage unbalance and load unbalance.

As described above, exemplary embodiments of the systems and methods detect open circuit switch faults at least in part based upon a current switching state of the NPC converter. Therefore, embodiments of the system and method can perform a fault diagnosis within one within one or multiple/modulation switching cycles, which enables the systems and or method to measure and evaluate the neutral point current value at each switching state.

EXAMPLES

Example 1

Figure 8:
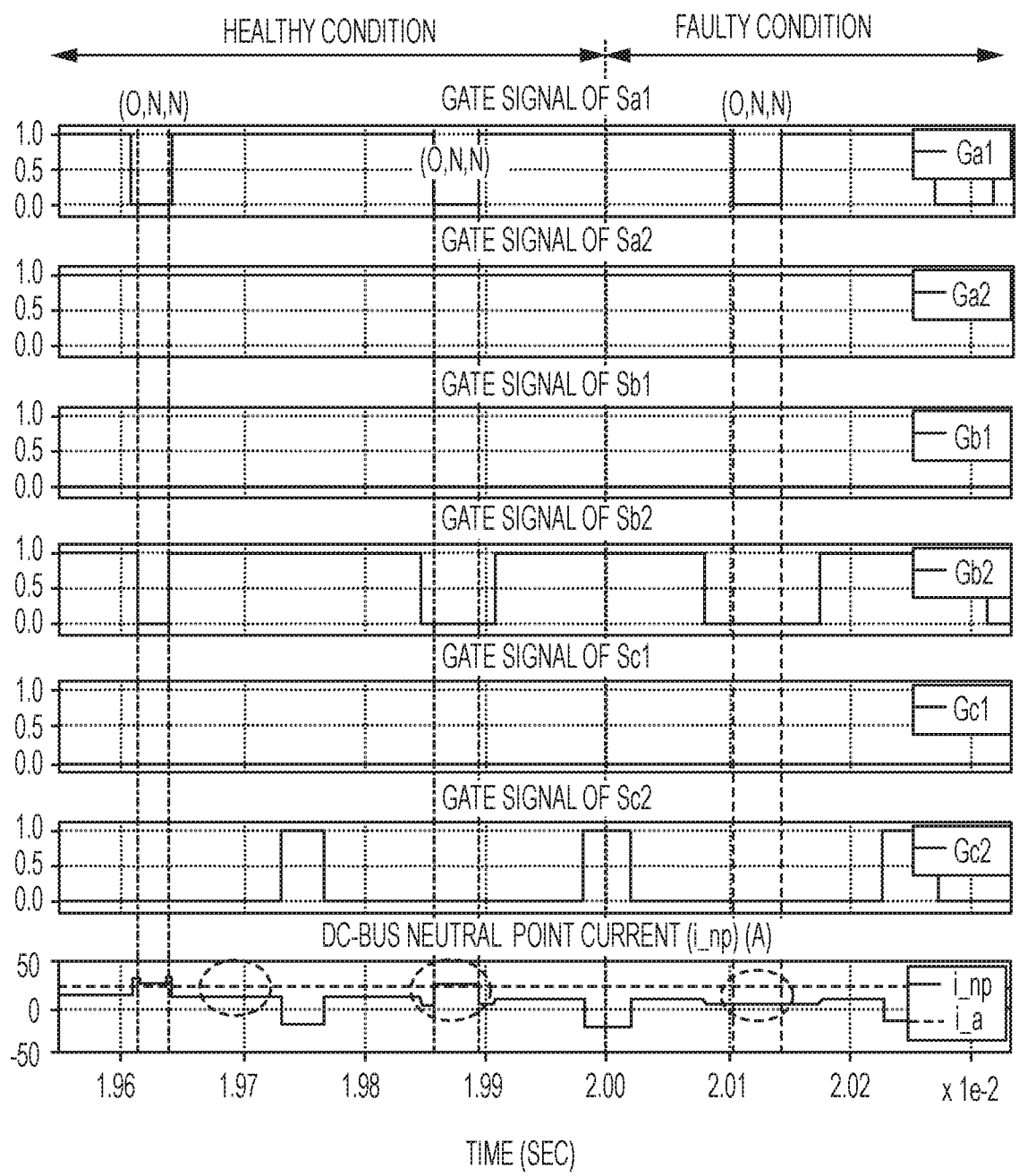

FIG. 8 is a graph that depicts the relative gate signals at various switching states, specifically state (O, N, N) along with the DC-bus neutral point current resulting at these states both under a healthy circuit condition and at the faulty current condition of an open-circuit fault in $S_{a2}$. Under heathy condition, the value of $i_{np}$ at the switching state (O, N, N) is the same as the value of $i_a$ according to (1), which changes into zero when an open-circuit fault in $S_{a2}$ is triggered.

Example 2

Figure 9A:
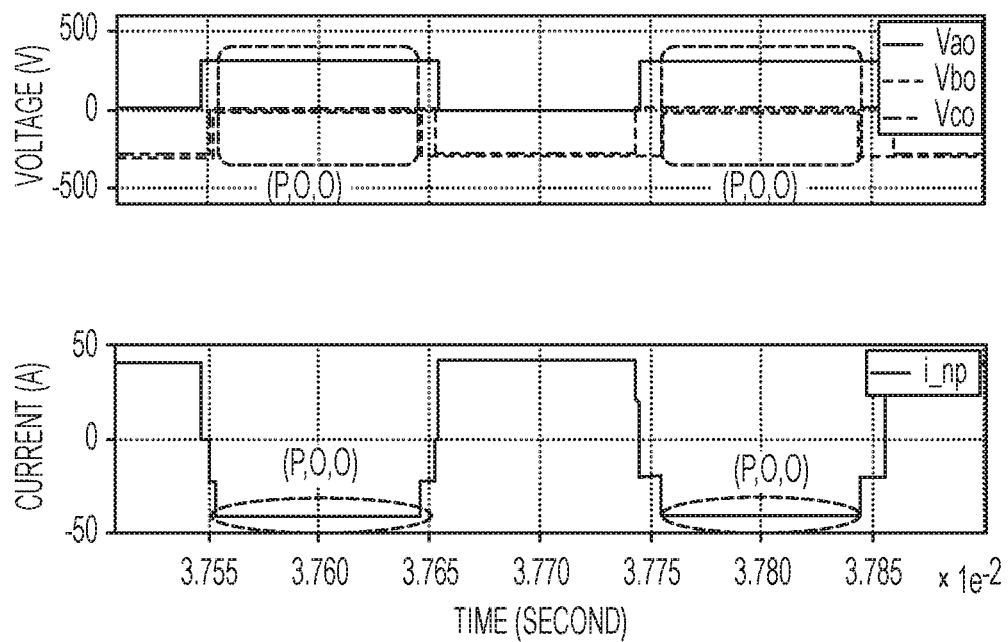
Figure 9B:
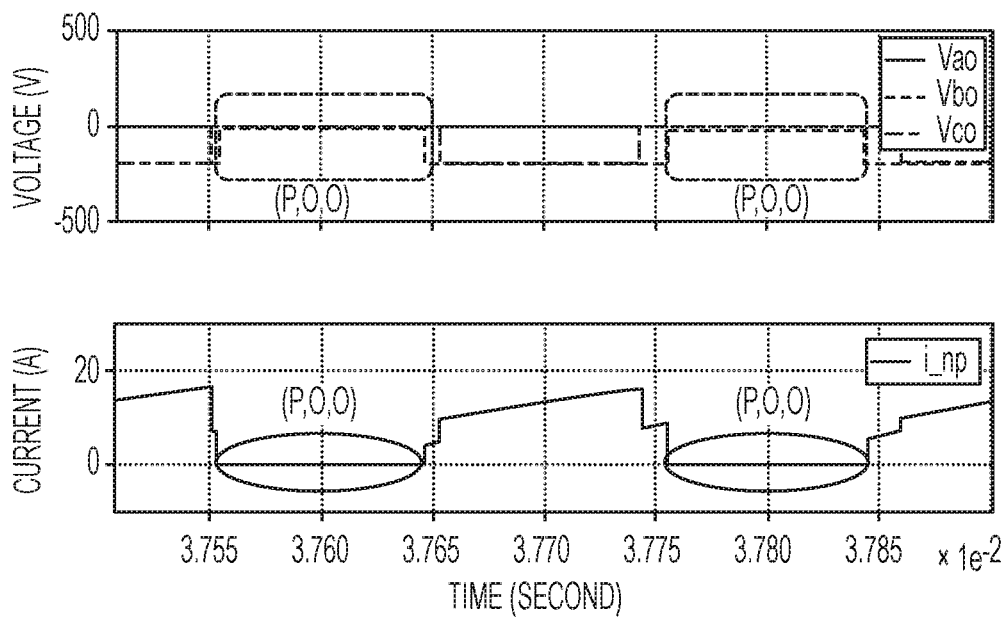

An open-circuit fault in $S_{a1}$, was simulated. The simulation used a DC-bus voltage of 600 volts, a DC-bus Capacitance of 400 μF, a switching frequency of 5 kHz, a load resistor of 5 ohms, a load inductor of 950 pH, and an output frequency of 60 Hz. FIG. 9A presents the three-phase pole voltages and the DC-bus neutral point current $i_{np}$ during a healthy circuit condition. FIG. 9B presents the three-phase pole voltages and the DC-bus neutral point current $i_{np}$ during an open-circuit fault in $S_{a1}$. As shown in FIGS. 9a and 9b, during the switching state (P, O, O) which is indicated by the three-phase pole voltages ($V_{ao}$, $V_{bo}$, $V_{co}$), the DC-bus neutral-point current, $i_{np}$, is a negative value (−40 A) under healthy condition as shown in FIG. 9A, which drops to a constant zero value under the same given switching state (P, O, O) when $S_{a1}$, has an open-circuit fault, as shown in FIG. 9B. This abnormal variation in $i_{np}$ results from the fact that the switching state (P, O, O) is forced to become (O, O, O) under the open-circuit faulty open-circuit condition of $S_{a1}$ at positive load current, and the value of $i_{np}$ at the switching state of (O, O, O) becomes zero according to Eq. 1 above. Through monitoring the value of $i_{np}$, the open-circuit fault in $S_{a1}$ can be diagnosed. As identified in Table I above, the switch state, (P, N, N), can also be used for detecting an open-circuit fault in $S_{a1}$.

Example 3

Figure 10A:
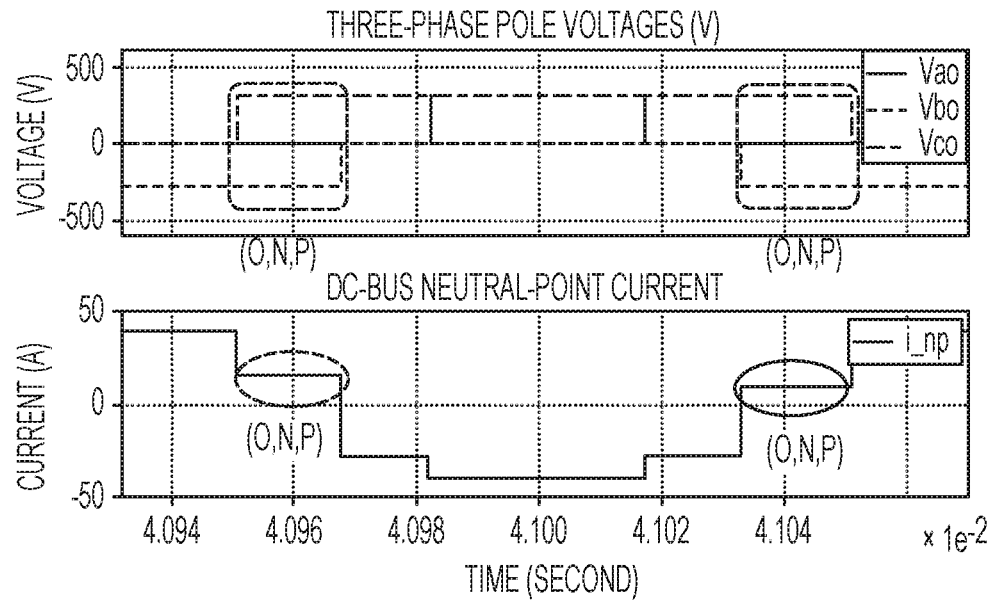
Figure 10B:
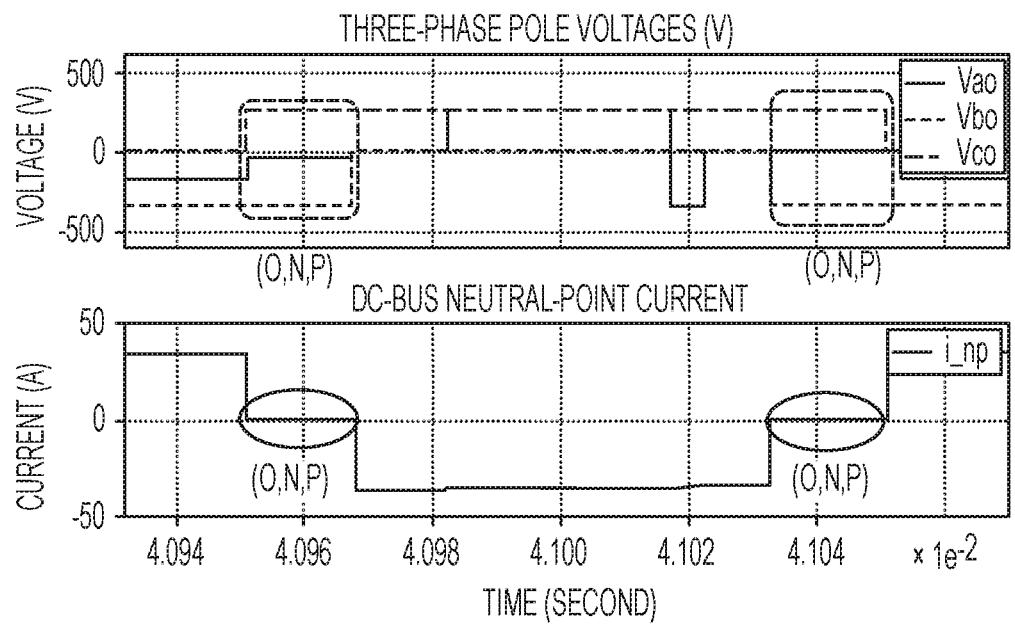

An open-circuit fault in $S_{a2}$, was simulated and examined under the same initial inverter conditions. FIG. 10A presents the three-phase pole voltages and the DC-bus neutral point current $i_{np}$ during a healthy circuit condition. FIG. 10B presents the three-phase pole voltages and the DC-bus neutral point current $i_{np}$ during an open-circuit fault in $S_{a2}$. As shown in FIGS. 10A and 10B, during the switching (O, N, P), the DC-bus neutral-point current, $i_{np}$, is a positive current (20 A) under a healthy condition as shown in FIG. 10A, which decreases to a constant zero value at the same given switching state (O, N, P) under the condition of an open-circuit fault in $S_{a2}$, as shown in FIG. 10B. This change in the DC-bus neutral-point current derives from the fact that the switching state (O, N, P) becomes (N, N, P) under such open-circuit faulty condition, which can be explained by reference to Eq. 1 above. It should be noted that the variations of the neutral-point current under three other switching states, namely, (O, P, N), (O, P, P), and (O, N, N), can also be used to identify the open-circuit fault in $S_{a2}$.

Example 4

A 20-kVA ASD based on a three-phase three-level SiC T-Type inverter was experimentally designed and implemented for testing. The main operation parameters of the ASD prototype were used a DC-bus voltage of 600 volts, an inverter rated power of 20 kW, a switching frequency of optionally 5 kHz and 10 kHz to evaluate both high and low inverter switching frequencies although a person of ordinary skill in the art will recognize that other embodiments may use higher or lower switching frequencies than this example, a modulation index of 0.7 per unit, a load resistor of 5 ohms, a load inductor of 950 pH, and an output frequency of 60 Hz. The open-circuit faults in the switches were emulated by disabling the related gate signals. The fault signatures, namely, the variations of the DC-bus neutral point current, $i_{np}$, at certain switching states, were monitored and captured by using a high-bandwidth oscilloscope, when an open-circuit switch fault was enabled. Again, the switching states, (P, O, O), (P, N, N), or (O, N, P), are represented by three-phase inverter pole voltages ($V_{ao}$, $V_{bo}$, $K_{co}$), due to the limited scope channels if using numerous inverter gates signals for illustration.

An open-circuit fault implemented in $S_{a1}$, under a switching frequency of 5 kHz produced a change in the value of $i_{np}$ from an average value of −12 A to almost zero at the switching state (P, O, O). Additionally, the variation of the $i_{np}$ at the switching state (P, N, N) also produces another effective fault signature, where the value of $i_{np}$ changes from constant zero under healthy condition to an average value of −6.5 A. These results were also verified at an inverter switching frequency of 10 kHz.

An open-circuit fault implemented in $S_{a2}$ under a switching frequency of 5 kHz produced a change in the value of $i_{np}$ from an average value of 10 A to quasi-zero value at the switching state (O, N, P). The same fault diagnosis test for an open-circuit fault in $S_{a2}$ was repeated for an inverter switching frequency of 10 kHz, confirming the results. At the 10 kHz switching frequency, a high-frequency ringing in the Phase-A pole voltage ($V_{ao}$) was observed which was caused by the resonance between the transistor output capacitance and the load inductance. Nevertheless, such parasitic ringing will affect the fault diagnostic accuracy, because the real PWM switching states will be used in a practical implementation, rather than using pole voltages as in the experiment.

In order to further examine the robustness to external disturbance, a load unbalance was created by increasing the load resistance of Phase-A from 5Ω to 10Ω while the RL load parameters on other two phases keep the same (i.e., $R_f$=5Ω, $L_f$=950 μH). The fault diagnostic experiment for an open-circuit fault in $S_{a1}$ was conducted under such unbalanced load condition. The load unbalance did not affect the efficacy of the proposed diagnostic method, which is consistent with similar simulation results reported above.

Citations to a number of references are made herein. The cited references are incorporated by reference herein in their entireties. In the event that there is an inconsistency between a definition of a term in the specification as compared to a definition of the term in a cited reference, the term should be interpreted based on the definition in the specification.

In the above description, certain terms have been used for brevity, clarity, and understanding. No unnecessary limitations are to be inferred therefrom beyond the requirement of the prior art because such terms are used for descriptive purposes and are intended to be broadly construed. The different systems and method steps described herein may be used alone or in combination with other systems and methods. It is to be expected that various equivalents, alternatives and modifications are possible within the scope of the appended claims.

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of diagnosing an open-circuit fault in a power converter, the method comprising:
   receiving a neutral point current value;
   receiving a switching state of the power converter;
   receiving load current values;
   identifying at least one fault condition based upon the switching state of the power converter and the load current values;
   comparing the neutral point current value to the at least one fault condition;
   determining an open-circuit fault is present at the switching state based upon the comparison; and
   initiating a response based upon the determination of the open-circuit fault.

2. The method of claim 1, wherein the power converter is a neutral-point clamped (NPC) power converter.

3. The method of claim 2, wherein the NPC power converter is a three-phase power converter and the load current values comprise an A phase leg load current value, a B phase leg load current value, and a C phase leg load current value.

4. The method of claim 1, wherein the switch devices comprise at least one of Insulated Gate Bipolar Transistors (IGBT) and Metal Oxide Field Effect Transistors (MOSFET).

5. The method of claim 1, wherein determining the at least one fault condition further comprises:
   calculating an expected neutral point current value based upon the switching state of the power converter and the load current values;
   comparing the received neutral point current value to the expected neutral point current value; and
   determining a probable fault condition based upon the comparison.

6. The method of claim 5, wherein determining the at least one fault condition further comprises:
   identifying at least one fault condition based upon the switching state of the power converter; and
   comparing the received neutral point current value to the at least one fault condition;
   wherein the open-circuit fault is determined to be present based upon the comparison.

7. The method of claim 1, wherein determining the at least one fault condition further comprises:

identifying at least one confirmation condition based upon the switching state of the power converter and at least one fault condition compared to the neutral point current value; and comparing the neutral point current value to the at least one confirmation condition;

wherein determining the open-circuit fault to be present further comprises identifying a location of the open-circuit fault based upon the comparison of the neutral point current value to the at least one fault condition and at least one confirmation condition.

8. The method of claim 1, wherein determining the at least one fault condition further comprises:

identifying at least one fault condition based upon the switching state of the power converter; and comparing the received neutral point current value to the at least one fault condition;

wherein the open-circuit fault is determined to be present based upon the comparison.

9. The method of claim 8, wherein the at least one fault condition is a value selected from zero, and the load current values.

10. The method of claim 8, wherein determining the at least one fault condition further comprises:

identifying at least one confirmation condition based upon the switching state of the power converter and at least one fault condition compared to the neutral point current; and upon determining that the neutral point current value meets at least one fault condition, comparing the received neutral point current value to the at least one confirmation condition;

wherein determining the open-circuit fault to be present further comprises identifying a location of the open-circuit fault based upon the comparison of the neutral point current value to the at least one fault condition and at least one confirmation condition.

11. The method of claim 10, wherein identifying the at least one fault condition and identifying the at least one confirmation condition comprises referencing a look-up table with the switching state of the power converter to point to the at least one fault condition and at least one confirmation condition.

12. The method of claim 1, wherein the power converter comprises at least one auxiliary switch and the response comprises operating at least one auxiliary switch to remediate the detected open-switch fault.

13. The method of claim 1, wherein the response comprises operating a graphical display to present a report of the detected open-switch fault and a location of the open-switch fault.

14. A system for diagnosing open-circuit faults in a multi-level power converter, the system comprising:

a neutral point current transducer configured to measure a neutral point current value from a DC-bus midpoint of the power converter;

load current transducers configured to measure load current values from a plurality of phase legs of the multi-level power converter; and a microcontroller that receives a switching state of the multi-level power converter, receives the neutral point current value from the neutral point current transducer, and receives the load current values from the load current transducers, the microcontroller further identifies least one fault condition based upon the switching state and the load current values, compares the neutral point current value to the at least one fault condition, determines an open-circuit fault is present at the switching state based upon the comparison, and initiates a response based upon the determination of the open-circuit fault.

15. The system of claim 14, wherein the microcontroller is configured to operate the multi-level power converter through a plurality of switching states, and the microcontroller provides the switching state to itself.

16. The system of claim 14, further comprising a current transducer that measures a value of the neutral point current and provides the value to the microcontroller.

17. The system of claim 14, wherein the microcontroller calculates an expected neutral point current value based upon the switching state of the power converter and the load current values, compares the received neutral point current value to the expected neutral point current value, and determines a probable fault condition based upon the comparison.

18. The system of claim 17, wherein if the microcontroller determines a probable fault condition, the microcontroller identifies at least one fault condition and at least one confirmation condition based upon the switching state of the power converter, compares the received neutral point current value to the at least one fault condition, and based upon the comparison to the at least one fault condition, compares the received neutral point current value to the at least one confirmation condition and determines the open-circuit fault to be present and identifies a location of the open-circuit fault based upon the comparisons.

19. The system of claim 14, further comprising:

wherein the microcontroller references a look-up table with the switching state of the power converter to point to the at least one fault condition and at least one confirmation condition to identify the at least one fault condition and at least one confirmation; and wherein the microcontroller compares the received neutral point current value to the at least one fault condition, and based upon the comparison to the at least one fault condition, compares the received neutral point current value to the at least one confirmation condition and determines the open-circuit fault to be present and identifies a location of the open-circuit fault based upon the comparisons.

20. A power converter that self-monitors for open-circuit faults, the power converter comprising:

a DC-bus having a positive terminal, a negative terminal, and a DC-bus midpoint;

a neutral point clamped (NPC) inverter electronically connected to the DC-bus at the positive terminal, the negative terminal, and the DC-bus midpoint, the NPC inverter comprising a plurality of phase legs, each phase leg comprising a plurality of switches configured to operate to control the power delivered at each phase leg through a plurality of switching states;

a neutral point current transducer connected to the DC-bus midpoint to measure a neutral point current value;

a plurality of load current transducers with a load current transducer of the plurality of load current transducers connected to each phase leg of the plurality of phase legs, to measure load current values from each of the plurality of phase legs; and a microcontroller that is operatively connected to the NPC inverter to operate each of the switches of the NPC inverter through the plurality of switching states, the microcontroller receives the neutral point current value from the neutral point current transducer and receives the load current values from the load current transducers, the microcontroller further identifies least one fault condition based upon a current switching state of the NPC inverter and the load current values, compares the neutral point current value to the at least one fault condition, determines an open-circuit fault is present at the switching state based upon the comparison, and initiates a response based upon the determination of the open-circuit fault.

21. The power converter of claim 20, wherein the NPC power converter comprises a T-type or an I-Type converter.

22. The power converter of claim 20, wherein the microcontroller calculates an expected neutral point current value based upon the switching state of the power converter and the load current values, compares the received neutral point current value to the expected neutral point current value, and determines a probable fault condition based upon the comparison.

23. The power converter of claim 22, wherein if the microcontroller determines a probable fault condition, the microcontroller identifies at least one fault condition and at least one confirmation condition based upon the switching state of the power converter, compares the received neutral point current value to the at least one fault condition, and based upon the comparison to the at least one fault condition, compares the received neutral point current value to the at least one confirmation condition and determines the open-circuit fault to be present and identifies a location of the open-circuit switch fault based upon the comparisons.

24. The power converter of claim 20, further comprising:
wherein the microcontroller references a look-up table with the switching state of the power converter to point to the at least one fault condition and at least one confirmation condition to identify the at least one fault condition and at least one confirmation; and
wherein the microcontroller compares the received neutral point current value to the at least one fault condition, and based upon the comparison to the at least one fault condition, compares the received neutral point current value to the at least one confirmation condition and determines the open-circuit switch fault to be present and identifies a location of the open-circuit fault based upon the comparisons.

* * * * *